United States Patent
Kim

(10) Patent No.: US 7,298,182 B2
(45) Date of Patent: Nov. 20, 2007

(54) COMPARATOR USING DIFFERENTIAL AMPLIFIER WITH REDUCED CURRENT CONSUMPTION

(75) Inventor: Jung Pill Kim, Cary, NC (US)

(73) Assignee: Infineon Technologies AG, Munich (DE)

( * ) Notice: Subject to any disclaimer, the term of this patent is extended or adjusted under 35 U.S.C. 154(b) by 154 days.

(21) Appl. No.: 10/867,896

(22) Filed: Jun. 15, 2004

(65) Prior Publication Data

US 2005/0275435 A1    Dec. 15, 2005

(51) Int. Cl.
*H03K 5/22* (2006.01)
(52) U.S. Cl. .............................. 327/77; 327/65; 327/66; 327/79; 330/252
(58) Field of Classification Search ................ 327/544, 327/182, 89, 88, 87, 86, 85, 84, 83, 82, 81, 327/80, 79
See application file for complete search history.

(56) References Cited

U.S. PATENT DOCUMENTS

| | | | | |
|---|---|---|---|---|
| 3,735,151 | A * | 5/1973 | Frederiksen et al. ........... | 327/77 |
| 4,897,560 | A * | 1/1990 | Saito et al. .................. | 327/544 |
| 5,570,047 | A * | 10/1996 | Makino et al. ................ | 327/80 |
| 6,137,320 | A * | 10/2000 | Takai .......................... | 327/56 |
| 6,339,344 | B1 * | 1/2002 | Sakata et al. ................. | 326/83 |
| 6,700,425 | B1 * | 3/2004 | Pilling ........................ | 327/291 |
| 6,791,371 | B1 * | 9/2004 | Cheung ........................ | 327/63 |
| 2002/0011877 | A1 * | 1/2002 | Lim ............................ | 327/77 |

* cited by examiner

*Primary Examiner*—Quan Tra
*Assistant Examiner*—Khareem E Almo
(74) *Attorney, Agent, or Firm*—Patterson & Sheridan, L.L.P.

(57) ABSTRACT

A comparator circuit with reduced current consumption, and other circuits utilizing the same, are provided. The comparator circuit may achieve reduced current consumption by preventing current flow via a switching transistors responsive to the voltage level of the input signal.

10 Claims, 6 Drawing Sheets

COMPARATOR USING DIFFERENTIAL AMPLIFIER WITH REDUCED CURRENT CONSUMPTION

BACKGROUND OF THE INVENTION

1. Field of the Invention

The present invention generally relates to integrated circuit devices and, more particularly to comparator circuits utilized in integrated circuit devices.

2. Description of the Related Art

Integrated circuit devices (ICs) utilize comparator circuits for a variety of purposes. As an example, an IC device, such as a dynamic random access memory (DRAM) device may utilize a comparator circuit to determine the state of an input signal (e.g., an internal control signal) by comparing the voltage level of the input voltage signal against a reference voltage signal. Such a comparator circuit is commonly implemented utilizing a differential amplifier that generates an output signal by amplifying the difference between the input signal and the reference voltage signal.

FIG. 1A illustrates one example of a conventional comparator circuit 100A utilizing a differential amplifier circuit to generate an output signal $V_{OUT}$ indicative of the condition of an input signal $V_{IN}$ relative to a reference voltage $V_{REF}$. The differential amplifier includes an arrangement of PMOS load transistors (MPA and MPB) and NMOS input transistors (MNA and MNB). The differential amplifier generates the single ended output $V_{OUT}$ that represents an amplification of the difference between $V_{REF}$ and $V_{IN}$.

In operation, if the voltage level of $V_{REF}$ is greater than the voltage level of $V_{IN}$, the current flowing through MNA ($I_A$) will be greater than the current flowing through MNB ($I_B$) and, thus, the potential at output node B will be high. On the other hand, if the voltage level of $V_{REF}$ is less than $V_{IN}$, the current flowing through MNA ($I_A$) will be less than the current flowing through MNB ($I_B$) and, thus, the potential at output node B will be low. Unfortunately, in this arrangement, the differential amplifier suffers from constant current consumption ($I_{REF}$), regardless of the state of the input signal $V_{IN}$.

FIG. 1B illustrates an example of another type of conventional comparator circuit 100B utilizing a differential amplifier circuit with PMOS input transistors (MPA and MPB). In this arrangement, if the voltage level of $V_{REF}$ is less than the voltage level of $V_{IN}$, the current flowing through MPA ($I_A$) will be greater than the current flowing through MNB ($I_B$) and, thus, the potential at output node B will be high. If the voltage level of $V_{REF}$ is greater than $V_{IN}$, the current flowing through MPA ($I_A$) will be less than the current flowing through MPB ($I_B$) and, thus, the potential at output node B will be low. Unfortunately, the differential amplifier in this arrangement also suffers from constant current consumption ($I_{REF}$), from comparator circuit 110B regardless of the state of the input signal $V_{IN}$.

This constant current consumption makes utilizing these types of comparators problematic in applications requiring minimal power consumption, such as in DRAM devices used in portable electronics, such as laptop computers, mobile phones, and personal digital assistants (PDAs). Accordingly, there is a need for a comparator circuit with reduced current consumption.

SUMMARY OF THE INVENTION

The present invention generally provides comparator circuits with reduced current consumption, and other circuits utilizing the same.

One embodiment provides a comparator circuit generally including a current source, differential amplifier and switching transistor. The differential amplifier provides an output voltage signal indicative of voltage level of an input voltage signal applied to first input transistor relative to a reference voltage signal applied to a second input transistor, wherein the first and second input transistors are coupled at a common node. The switching transistor is positioned to prevent the flow of current between the current source and the common node in response to a switching voltage signal applied to the switching transistor, wherein the switching voltage signal is derived from the input voltage signal.

Another embodiment provides an oscillator circuit generally including a capacitor having a voltage due to stored charge, a first current source to charge the capacitor, and a comparator circuit for providing an output voltage signal indicative of the capacitor voltage applied to a first input transistor relative to a reference voltage signal applied to a second input transistor, wherein the first and second input transistors are coupled at a common node. A switching transistor is positioned to prevent the flow of current between a second current source and the common node in response to a switching voltage signal applied to the switching transistor, wherein the switching voltage signal is derived from the capacitor voltage. A precharge transistor is positioned to discharge the capacitor in response to a precharge signal derived from the output voltage signal.

Another embodiment provides a memory device generally including a plurality of memory cells, circuitry for refreshing the memory cells in response to a pulsed refresh signal, and an oscillator circuit for generating the pulsed refresh signal. The oscillator circuit generally includes a capacitor having a voltage due to stored charge, a first current source to charge the capacitor, a comparator circuit for providing an output voltage signal indicative of the capacitor voltage applied to a first input transistor relative to a reference voltage signal applied to a second input transistor, wherein the first and second input transistors are coupled at a common node. A switching transistor is positioned to prevent the flow of current between a second current source and the common node in response to a switching voltage signal applied to the switching transistor, wherein the switching voltage signal is derived from the capacitor voltage. The oscillator circuit also includes a pulse generator for generating the pulsed refresh signal in response to a change in the output voltage signal and a precharge transistor positioned to discharge the capacitor in response to a precharge signal derived from the output voltage signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a comparator circuit with reduced current consumption relative to conventional comparator circuits. As previously described, conventional comparator circuits utilizing differential amplifiers consume current regardless of the voltage level of the input signal. In contrast, comparator circuits in accordance with the present invention may reduce current consumption by preventing current flow via a switching transistors responsive to the voltage level of the input signal.

For some embodiments, the switching transistor may prevent the flow of current in a current path between a common node of input transistors and a current source, when the voltage level of the input signal falls below (or exceeds) a threshold level. As will be described in greater detail below, such comparator circuits may be utilized as building blocks in a variety of circuits, such as oscillator circuits. Such oscillator circuits may be utilized in DRAM devices, for example, to generate a periodic signal for use in self-refreshing DRAM memory cells, while reducing current consumption during self-refresh operations.

An Exemplary Comparator Circuit

Figure 1A:
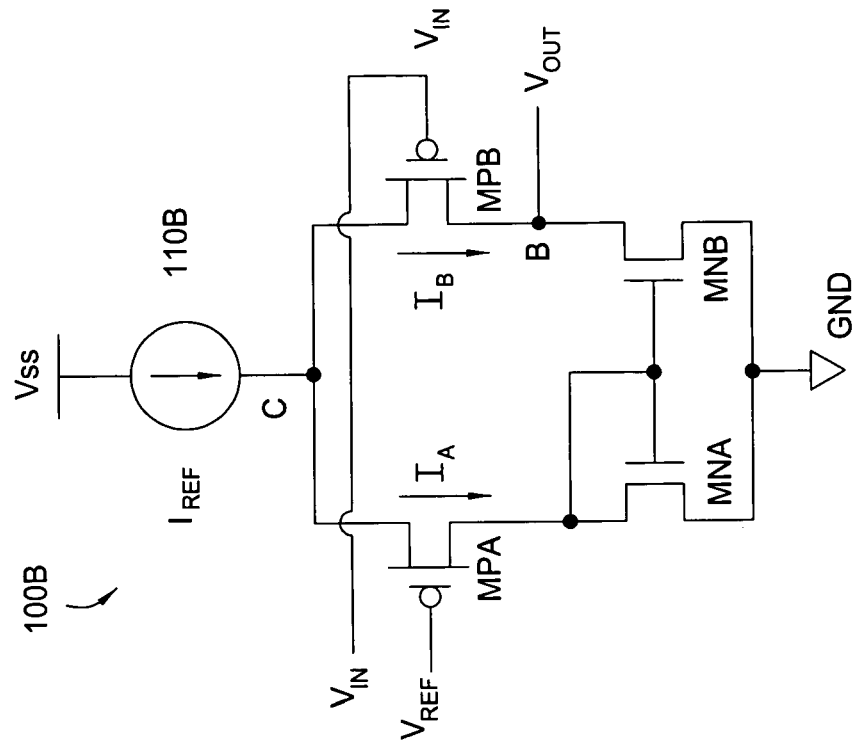
FIGS. 1A and 1B illustrate exemplary comparator circuits in accordance with the prior art.
Figure 1B:
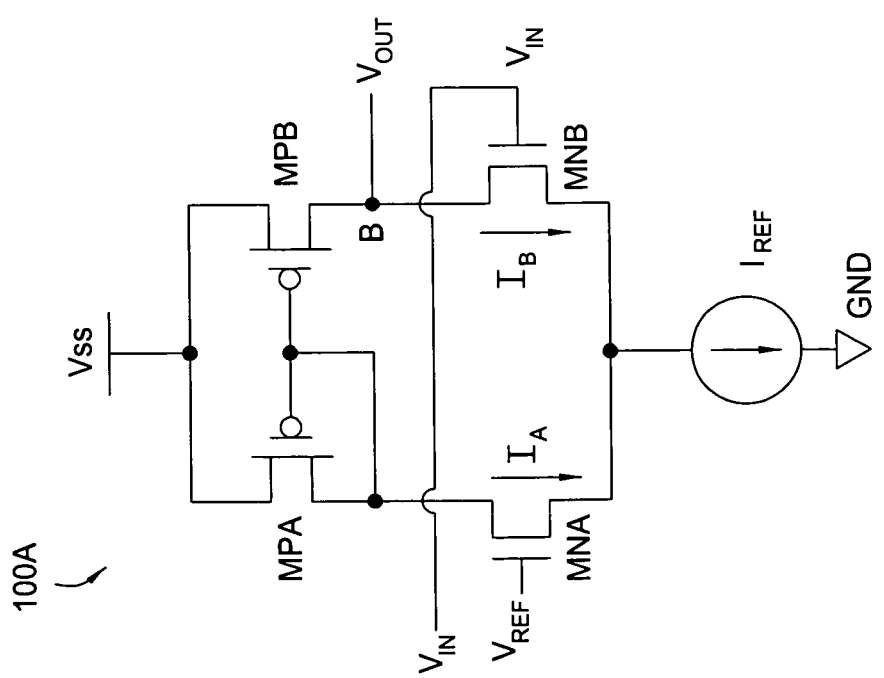
Figures 2A, 2B:
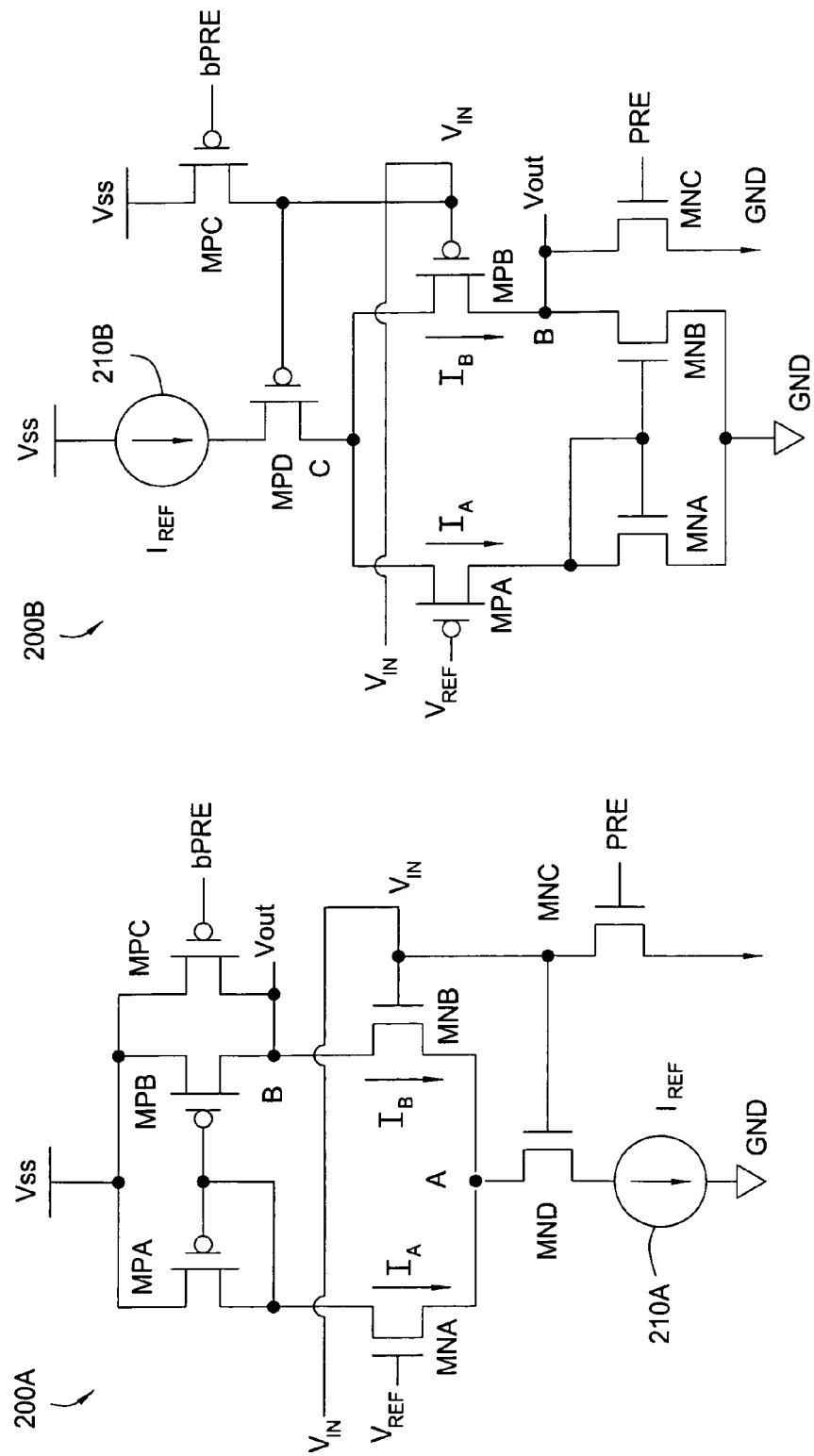
FIGS. 2A-2C illustrate exemplary comparator circuits in accordance with embodiments of the present invention.

FIG. 2A illustrates a comparator circuit 200A utilizing a differential amplifier circuit and an NMOS switching transistor MND, in accordance with one embodiment of the present invention. The comparator circuit 200A is configured to generate an output signal $V_{OUT}$ indicative of the voltage level of an input signal $V_{IN}$ relative to a reference voltage level $V_{REF}$.

However, by positioning the switching transistor MND in a current path between a common node A of the input transistors MNA and MNB and a current source 210A, current consumption of the comparator circuit 200A can be reduced. For example, by applying the input voltage signal $V_{IN}$ to the gate of the switching transistor MND, as illustrated, current will only flow in the current path when $V_{IN}$ exceeds the switching threshold voltage ($V_{T-N}$) of the switching transistor MND, typically 0.4V to 0.5V. Thus, while $V_{IN}$ is below $V_{T-N}$, there is no current consumption in the comparator 200A (ignoring leakage currents).

Figure 3B:
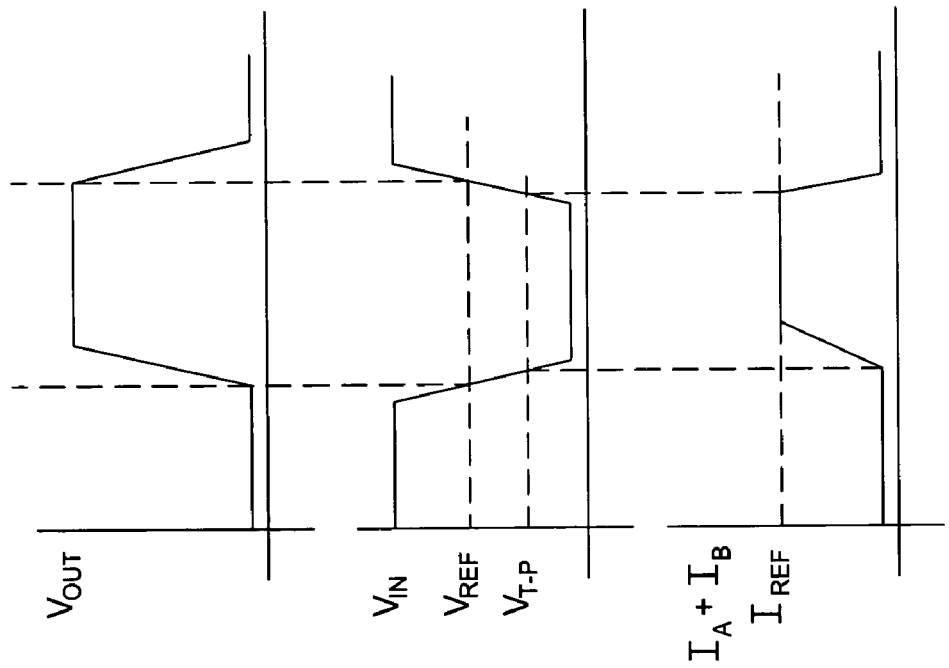
FIGS. 3A and 3B are exemplary timing diagrams corresponding to the comparator circuit FIGS. 2A and 2B, respectively, in accordance with embodiments of the present invention.
Figure 3A:
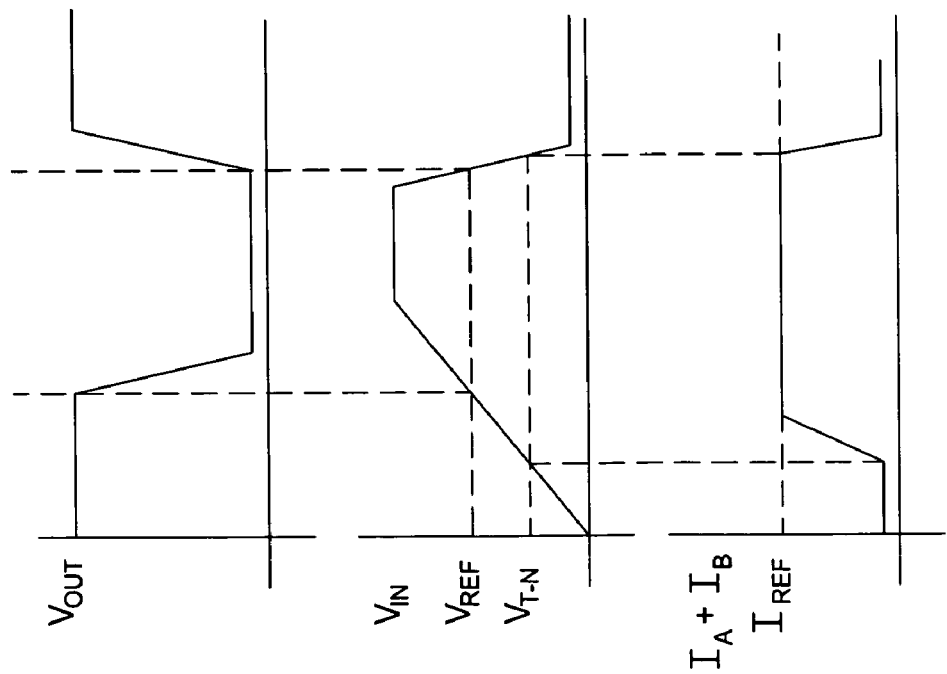

Operation of the comparator circuit 200A may be described with reference to FIG. 3A which is a timing diagram of $V_{OUT}$ and the current flow through the current path ($I_A+I_B$) versus $V_{IN}$. As illustrated, $V_{OUT}$ is initially high, $V_{IN}$ is initially low, and $V_{REF}$ is set above the threshold voltage level of the switching transistor MND. While $V_{IN}$ is below the threshold voltage of $V_{ND}$, there is no current consumption (i.e., $I_A+I_B=0$). Once $V_{IN}$ increases above $V_{T-N}$, the switching transistor MND is switched on, and current flow through the current path increases to $I_{REF}$.

While the current flow through the current path should remain substantially constant while MND is switched on, as long as $V_{IN}$ is below $V_{REF}$, the current flow through MNA ($I_A$) will be greater than the current flow through MNB ($I_B$) and $V_{OUT}$ will remain high. However, once $V_{IN}$ increases above $V_{REF}$, the current flow through MNB will be greater than the current flow through MNA and $V_{OUT}$ will transition low. As illustrated, as $V_{IN}$ decreases below $V_{REF}$ and further below $V_{T-N}$, $V_{OUT}$ will return high and the current flow will again return to zero.

FIG. 2B illustrates a comparator circuit 200B, similar in operation to comparator circuit 200A, but utilizing a differential amplifier circuit and a PMOS switching transistor MPD. As illustrated, MPD may be positioned between a current source 210B and PMOS input transistors MPA and MPB, with $V_{IN}$ applied to the gate of MPD. Thus, current draw of the comparator circuit 200B may be reduced when $V_{IN}$ is above the threshold voltage of MPD ($V_{T-P}$).

Operation of the comparator circuit 200B may be described with reference to the corresponding timing diagram shown in FIG. 3B. As illustrated, $V_{IN}$ is initially high, $V_{OUT}$ is initially low, and $V_{REF}$ is set above $V_{T-P}$. While $V_{IN}$ remains above $V_{T-P}$, there is no current consumption (i.e., $I_A+I_B=0$). Once $V_{IN}$ falls below $V_{T-P}$, the switching transistor MPD is switched on, and current flow increases to $I_{REF}$. Also, as $V_{IN}$ is below $V_{REF}$ at this time, the current flow through MPA ($I_A$) will be greater than the current flow through MPB ($I_B$) and, thus, the potential at output node B will transition high. As illustrated, as $V_{IN}$ increases above $V_{T-P}$ and $V_{REF}$, the current flow will again return to zero and $V_{OUT}$ may transition low. In this scenario, as $V_{IN}$ is already below $V_{REF}$ when MPD is switched on, $I_B$ may never exceed $I_A$. Thus, to obtain the desired initial conditions of $V_{IN}$ and $V_{OUT}$, precharging transistors MPC and MNC may be used to initialize the $V_{IN}$ and $V_{OUT}$ to VSS and GND, respectively.

Whether a comparator circuit with an NMOS switching transistor (200A) or PMOS switching transistor (200B) is used may depend on a particular application. In other words, applications where $V_{IN}$ is likely to be low (below $V_{T-N}$) a majority of the time may achieve greater current savings with an NMOS switching transistor, while applications where $V_{IN}$ is likely to be high (above $V_{T-P}$) a majority of the time may achieve greater current savings with an PMOS switching transistor. For some applications utilizing a variety of input voltage signals, a combination of comparator circuits utilizing both NMOS and PMOS switch transistors may be utilized.

For some embodiments, the input signal $V_{IN}$ may be precharged to a desired value that may result in the prevention of current flow. For example, as illustrated in FIG. 2A, $V_{IN}$ may be precharged to ground via an NMOS precharge transistor MNC during a high period of a precharge signal (PRE), switching off MND. $V_{IN}$ may then be raised to a certain voltage, just above $V_{REF}$, such as 1V. Until $V_{IN}$ reaches $V_{T-N}$, MND will be switched off and, thus, the differential amplifier will not consume current. To achieve a similar effect in FIG. 2B, $V_{IN}$ may be precharged to a power supply voltage ($V_{SS}$) via a PMOS precharge transistor MPC during a low period of a precharge signal bPRE, switching off MPD. As illustrated, output signals $V_{OUT}$ may also be precharged, for example using complementary transistors and signals to those used to precharge $V_{IN}$.

Figure 2C:
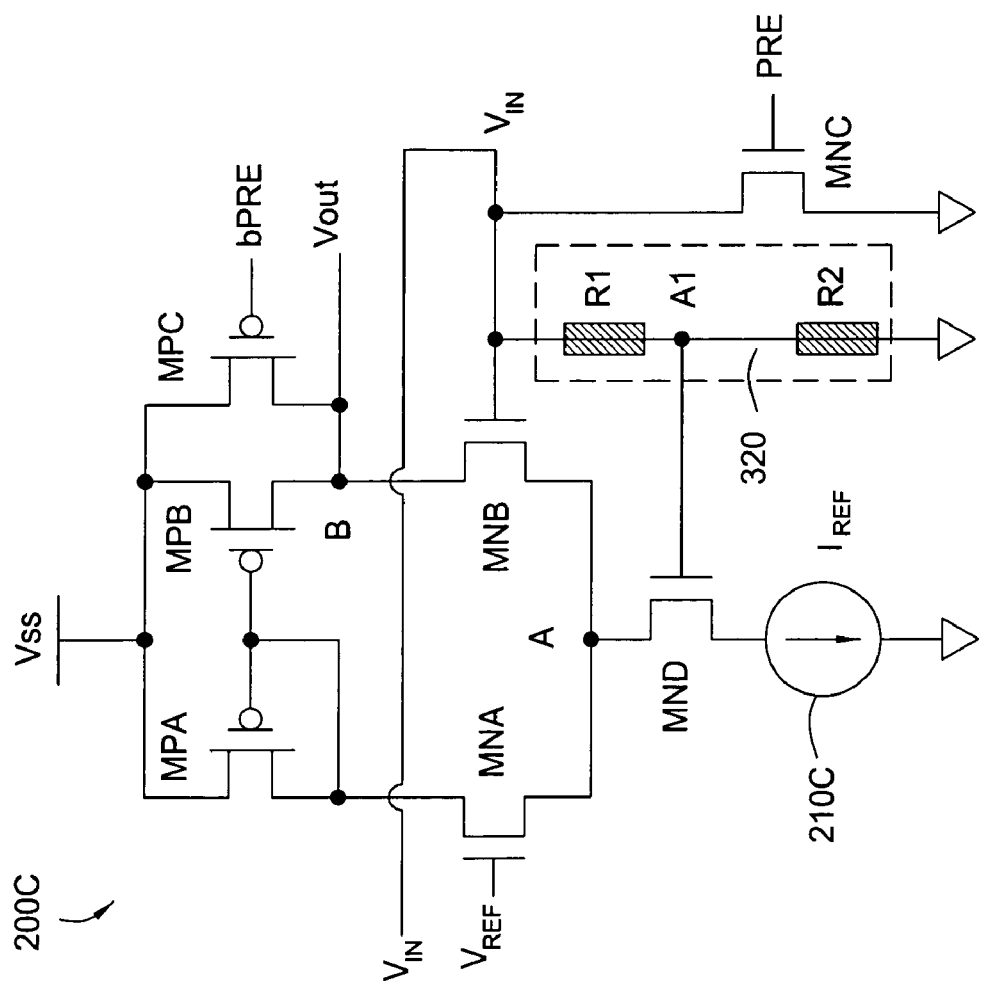

For some embodiments, rather than apply $V_{IN}$ directly to the switch transistor (e.g., MPD or MPN), a switching voltage may be derived from $V_{IN}$, which may provide greater control of the switching point. For example, as illustrated in FIG. 2C, a voltage generating circuit, such as a voltage divider 320, may be utilized to generate a switching voltage to be applied to the switching transistor MND, as a function of $V_{IN}$. The values of resistors R1 and R2 of the voltage divider 320 may be selected to effectively cause MND to switch the current off at a desired higher voltage level of $V_{IN}$ than if $V_{IN}$ were applied to the gate of NMD directly.

An Exemplary Oscillator Circuit

Comparator circuits, such as those illustrated in FIGS. 2A-2C may be particularly effective at reducing current in applications where $V_{IN}$ increases or decreases slowly and has a relatively low frequency oscillation, as the current consumption may be switched off a majority of the time in such applications. One such application is to reduce current consumption in an oscillator circuit, such as the self-refresh oscillator 400 shown in FIG. 4 used to generate self-refresh request signals. As illustrated, refresh control circuitry 402 may receive the refresh request signals and, in response, refresh a row of memory cells 404. The refresh control circuitry may include any suitable circuitry, such as a row address counter (RAC) configured to increment a count on each refresh request and row address decoder circuitry to generate an address of a row of memory cells 404 to be refreshed based on a counter.

Figure 4:
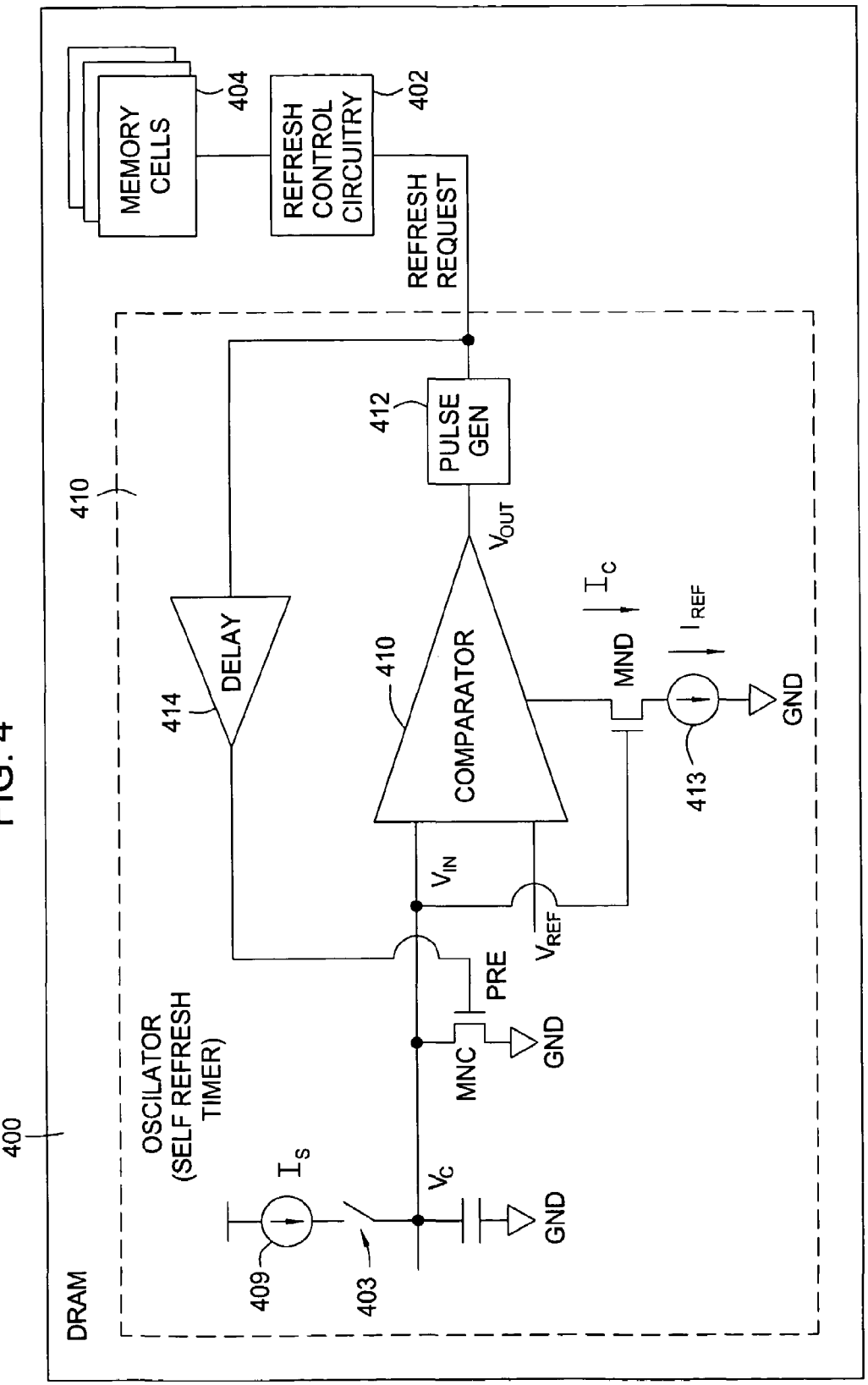
FIG. 4 illustrates a dynamic random access memory (DRAM) device utilizing an exemplary oscillator circuit in accordance with an embodiment of the present invention.
Figure 5:
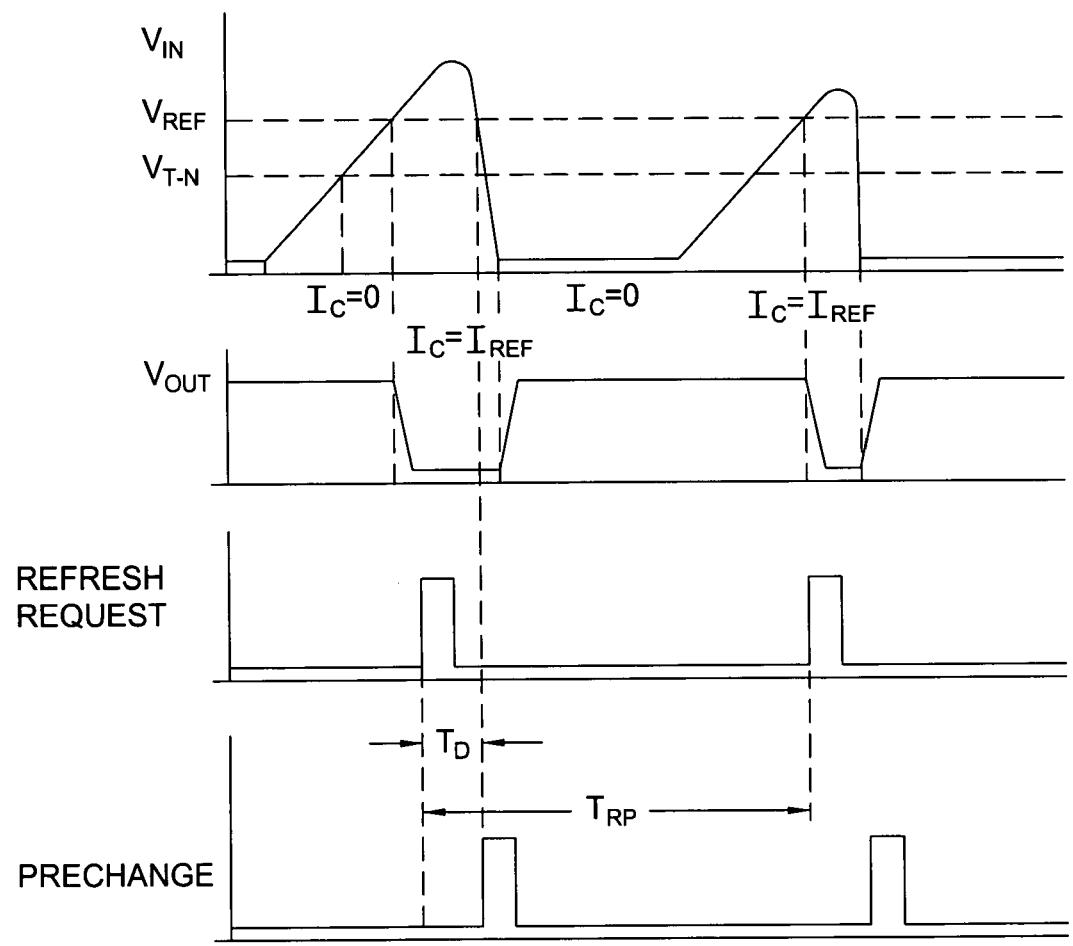
FIG. 5 is an exemplary timing diagram corresponding to the oscillator circuit of FIG. 4.

The oscillator circuit 410 may be described with simultaneous reference to FIG. 4 and the corresponding timing diagram shown in FIG. 5 that illustrates the relationship between $V_{IN}$, $V_{OUT}$, REFRESH_REQUEST and PRECHARGE signals. While the timing diagram corresponds to the timing of the comparator circuits 200A and 200C, utilizing NMOS switching transistors, it should be understood that comparator circuits utilizing PMOS switching (and/or precharge) transistors could be used as well. As illustrated, initially, $V_{OUT}$ is high and $V_{IN}$ is low, causing MND to be switched off, cutting off current flow of the comparator ($I_C$=0).

At a time t=0, a switch 403 (e.g., controlled by a self-refresh enable signal) is closed, causing current flow Is from a current source 404 to charge a capacitor C, the stored charge of which results in the voltage signal $V_{IN}$. Accordingly, $V_{IN}$ begins to rise at a rate determined by the size of C and the current $I_S$. As illustrated in FIG. 5, once $V_{IN}$ rises above $V_{T-N}$, MND switches on and $I_C$ rises to $I_{REF}$ (from current source 413). Once $V_{IN}$ rises above $V_{REF}$, $V_{OUT}$ transitions low, causing pulse generator 412 to generate a REFRESH_REQUEST pulse.

As illustrated in FIG. 5, the REFRESH_REQUEST signal may be fed back, via a delay circuit 414 (having a delay period TD) to a precharge transistor MNC to precharge $V_{IN}$ to ground (discharging capacitor C), again causing IC to fall and $V_{OUT}$ to rise. As capacitor C charges and $V_{IN}$ rises, this cycle will repeat periodically, causing REFRESH_REQUEST pulses spaced apart by the refresh period $T_{RP}$. The refresh period $T_{RP}$ may thus be controlled by controlling the rate at which $V_{IN}$ rises (e.g., via C and $I_S$), and the selected values for $V_{REF}$ and the delay period $T_D$.

CONCLUSION

The oscillator circuit 410 illustrates just one particular, but not limiting, application for a comparator circuit with reduced current consumption. Those skilled in the art will recognize that such comparator circuits may be used in a variety of devices that could benefit from reduced current consumption, such as different types of memory, processors, or other type logic devices.

While the foregoing is directed to embodiments of the present invention, other and further embodiments of the invention may be devised without departing from the basic scope thereof, and the scope thereof is determined by the claims that follow.

What is claimed is:

1. A comparator circuit, comprising:
 a current source;
 a differential amplifier for providing an output voltage signal indicative of a voltage level of an input voltage signal applied to a first input transistor relative to a reference voltage signal applied to a second input transistor, wherein the first and second input transistors are coupled at a common node;
 a switching transistor positioned to prevent the flow of current between the current source and the common node in response to a switching voltage signal applied to the switching transistor, wherein the switching voltage signal is derived from the input voltage signal; and
 a precharge transistor to precharge the input voltage signal to a predetermined value;
 wherein the switching transistor is a NMOS transistor and the switching voltage signal is derived from the input voltage signal such that the switching transistor prevents the flow of current between the current source and the common node when the input voltage signal falls below a threshold voltage and wherein the precharge transistor is responsive to a voltage signal derived from the output voltage signal.

2. The comparator circuit of claim 1, wherein the first and second input transistors are NMOS transistors.

3. The comparator circuit of claim 1, wherein the input voltage signal is applied directly to a gate of the switching transistor as the switching voltage signal.

4. The comparator circuit of claim 1, further comprising a voltage generator circuit for deriving the switching voltage signal from the input voltage signal.

5. The comparator circuit of claim 4, wherein the voltage generator circuit comprises a voltage divider circuit.

6. A comparator circuit, comprising:
 a current source;
 a differential amplifier for providing an output voltage signal indicative of a voltage level of an input voltage signal applied to a first input transistor relative to a reference voltage signal applied to a second input transistor, wherein the first and second input transistors are coupled at a common node;
 a switching transistor positioned to prevent the flow of current between the current source and the common node in response to a switching voltage signal applied to the switching transistor; and
 a precharge transistor to precharge the input voltage signal to a predetermined value;
 wherein the switching transistor is a PMOS transistor and the switching voltage signal is derived from the input voltage signal such that the switching transistor prevents the flow of current between the current source and the common node when the input voltage signal is above a threshold voltage and wherein the precharge transistor is responsive to a voltage signal derived from the output voltage signal.

7. The comparator circuit of claim 6, wherein the input voltage signal is applied directly to a gate of the switching transistor as the switching voltage signal.

8. The comparator circuit of claim 6, further comprising a voltage generator circuit for deriving the switching voltage signal from the input voltage signal.

9. The comparator circuit of claim 8, wherein the voltage generator circuit comprises a voltage divider circuit.

10. A comparator circuit, comprising:
a current source;
a differential amplifier for providing an output voltage signal indicative of a voltage level of an input voltage signal applied to a first input transistor relative to a reference voltage signal applied to a second input transistor, wherein the first and second input transistors are coupled at a common node;
a switching transistor positioned to prevent the flow of current between the current source and the common node in response to a switching voltage signal applied to the switching transistor, wherein the switching voltage signal is derived from the input voltage signal; and
a precharge transistor to precharge the input voltage signal to a predetermined value, wherein the precharge transistor is responsive to a voltage signal derived from the output voltage signal.

* * * * *